(12) United States Patent
Takahashi

(10) Patent No.: US 8,158,525 B2
(45) Date of Patent: Apr. 17, 2012

(54) PLASMA ETCHING METHOD AND APPARATUS, AND METHOD OF MANUFACTURING LIQUID EJECTION HEAD

(75) Inventor: Shuji Takahashi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 136 days.

(21) Appl. No.: 12/712,132

(22) Filed: Feb. 24, 2010

(65) Prior Publication Data

US 2010/0216260 A1 Aug. 26, 2010

(30) Foreign Application Priority Data

Feb. 26, 2009 (JP) ................................. 2009-044573

(51) Int. Cl.
*H01L 21/302* (2006.01)
*H01L 21/461* (2006.01)

(52) U.S. Cl. ........ 438/706; 438/707; 438/708; 438/709; 438/710; 438/714

(58) Field of Classification Search ........................ None
See application file for complete search history.

(56) References Cited

U.S. PATENT DOCUMENTS

| 2001/0025691 | A1 | 10/2001 | Kanno et al. | |
|---|---|---|---|---|
| 2005/0029227 | A1* | 2/2005 | Chapman | 216/59 |
| 2007/0193976 | A1* | 8/2007 | Tamura et al. | 216/61 |
| 2008/0258246 | A1* | 10/2008 | Furukawa et al. | 257/417 |

FOREIGN PATENT DOCUMENTS

| JP | 2001-338917 A | 12/2001 |
|---|---|---|
| JP | 2008-103428 A | 5/2008 |

* cited by examiner

*Primary Examiner* — Duy Deo
(74) *Attorney, Agent, or Firm* — Fish & Richardson P.C.

(57) ABSTRACT

The plasma etching method includes: an etching step of placing, on a stage in a chamber, a substrate in which a prescribed mask pattern is formed by a protective film on a surface of a material to be etched, generating a plasma in the chamber while supplying processing gas to the chamber, and etching a portion of the material corresponding to an opening portion in the mask pattern; a voltage measurement step of, during the etching in the etching step, measuring a voltage at the surface of the material on a side where the mask pattern is formed, through a conductive member that is placed in contact with the surface of the material on the side where the mask pattern is formed; and a control step of controlling an etching condition in the etching step in accordance with a measurement result obtained in the voltage measurement step.

12 Claims, 7 Drawing Sheets

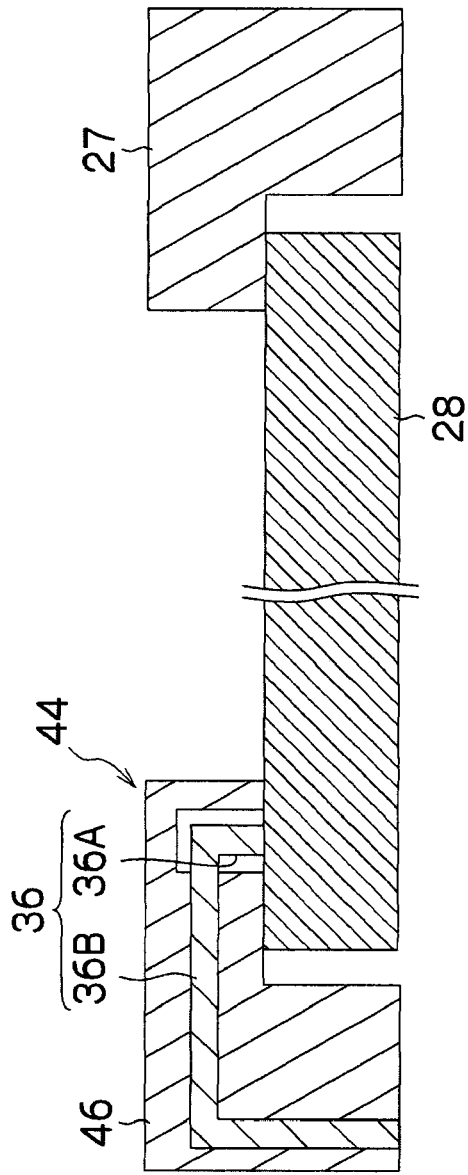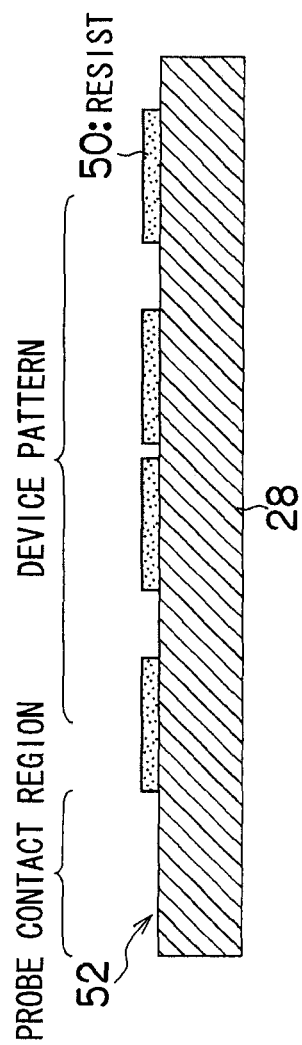

PLASMA ETCHING METHOD AND APPARATUS, AND METHOD OF MANUFACTURING LIQUID EJECTION HEAD

BACKGROUND OF THE INVENTION

1. Field of the Invention

The present invention relates to plasma etching technology, and more particularly, to a plasma etching method and apparatus suitable for the manufacture of an inkjet head, micro electric mechanical system (MEMS) devices of various types, semiconductor devices, and the like, and a method of manufacturing a liquid ejection head using same.

2. Description of the Related Art

Japanese Patent Application Publication No. 2008-103428 discloses a plasma etching machining method of precisely machining a substrate by dry etching using a plasma etching apparatus, and a method of manufacturing a liquid injection head using this plasma etching processing method. More specifically, a protective film (mask pattern) having openings of prescribed dimensions is formed on the substrate, and in a step of etching the substrate by dry etching in the plasma etching apparatus, the Vpp (peak-to-peak voltage) value of the electrode in the plasma etching apparatus (the difference of the RF bias voltage applied to the stage) is measured during the execution of the etching step, and the Vpp value set in each etching step is adjusted on the basis of the measured Vpp value measured in the preceding etching step.

In this method, the Vpp value is measured through the electrode of the plasma etching apparatus; however, since the value measured through the electrode that is disposed at a position distanced from the substrate is different from the Vpp or Vdc (self bias voltage) value at the surface of the substrate, then the measurement accuracy is poor, and high-precision processing cannot be carried out. Hence, the Vpp or Vdc value at the surface of the substrate that is actually etched is different from the value measured through the electrode, and must therefore be corrected in advance.

The etched targets (substrates) are many and various; for example, a silicon substrate on which metal and insulating films, and the like are formed, such as a silicon substrate on which an insulating layer ($SiO_2$), a wiring layer (Al) and an insulating layer ($SiO_2$) are sequentially overlaid. In many cases, the layer composition varies depending on the substrate to be etched, and if it is attempted to apply the technology in Japanese Patent Application Publication No. 2008-103428, correction must be made each time the layer composition of the substrate to be machined changes, and therefore efficiency is poor.

Moreover, there are also cases where a dummy substrate is bonded to the reverse surface of the machined substrate through a bonding layer, and apart from silicon, it is also possible to use glass or resin (e.g., polyethyleneterephthalate (PET)) for the dummy substrate. In cases of this kind, in the technology described in Japanese Patent Application Publication No. 2008-103428, it is difficult to measure accurately the surface voltage of the machined substrate.

On the other hand, Japanese Patent Application Publication No. 2001-338917 discloses a semiconductor manufacturing apparatus and processing method wherein the voltage at the semiconductor wafer during processing and the impedance from the wafer to earth through the plasma are determined by measurement or calculation, and the processing is performed on the basis of the impedance. In this method, a probe for measuring the voltage of the wafer at the rear surface of the wafer is arranged on the stage that holds the wafer, and the wafer voltage and the plasma impedance can be accurately determined by means of the wafer voltage probe and a current and voltage probe that measures the voltage and/or current applied to the stage. Thus, etching of good reproducibility can be achieved, and decline in the yield rate can be prevented by controlling the etching parameters on the basis of this information.

However, similar problems to the aforementioned occur with this technology. For example, in the case of deep etching, such as hole piercing to form through holes in a silicon substrate, the substrate being machined (processed substrate) is etched while being attached onto a sheet, such as a dicing tape, or being attached onto a dummy substrate; and in cases of this kind, the wafer voltage probe that measures the voltage of the substrate at the rear surface of the substrate is not able to measure the actual voltage of the processed substrate, since the probe makes direct contact with the sheet or dummy substrate instead of the processed substrate. Moreover, in cases where the sheet or the like is used, it is not possible to measure the wafer voltage.

Furthermore, in the case of manufacturing a MEMS device, the rear surface of the substrate to be etched is not necessarily flat, and there may be indentations in the rear surface, thin film may be formed on the rear surface, and so on, and therefore it may not be possible to bring the probe into contact with the rear surface. Consequently, with the technology described in Japanese Patent Application Publication No. 2001-338917, it is not possible to measure the voltage of the wafer.

SUMMARY OF THE INVENTION

The present invention has been contrived in view of these circumstances, an object thereof being to provide a plasma etching method and a plasma etching apparatus capable of high-precision processing, by being able to accurately measure the Vpp and/or Vdc value at the surface of a substrate during etching, and to provide a method of manufacturing a liquid ejection head employing the method and apparatus.

In order to attain the aforementioned object, the present invention is directed to a plasma etching method, comprising: an etching step of placing, on a stage in a chamber, a substrate in which a prescribed mask pattern is formed by a protective film on a surface of a material to be etched, generating a plasma in the chamber while supplying processing gas to the chamber, and etching a portion of the material corresponding to an opening portion in the mask pattern; a voltage measurement step of, during the etching in the etching step, measuring a voltage at the surface of the material on a side where the mask pattern is formed, through a conductive member that is placed in contact with the surface of the material on the side where the mask pattern is formed; and a control step of controlling an etching condition in the etching step in accordance with a measurement result obtained in the voltage measurement step.

According to the present invention, it is possible to accurately measure the voltage at the surface of the material to be etched of the substrate that faces the plasma, during the etching process, and the etching conditions can be suitably adjusted on the basis of this measurement result. By this means, it is possible to carry out high-precision processing and the reproducibility of processing between substrates is improved.

BRIEF DESCRIPTION OF THE DRAWINGS

FIG. 3 is a cross-sectional diagram showing an example of the wiring structure of a voltage measurement unit provided in a clamp ring;

FIG. 4 is a cross-sectional diagram for illustrating the positional relationship between the device forming region (device area) and a probe contact region on the substrate;

DETAILED DESCRIPTION OF THE PREFERRED EMBODIMENTS

Figure 1:
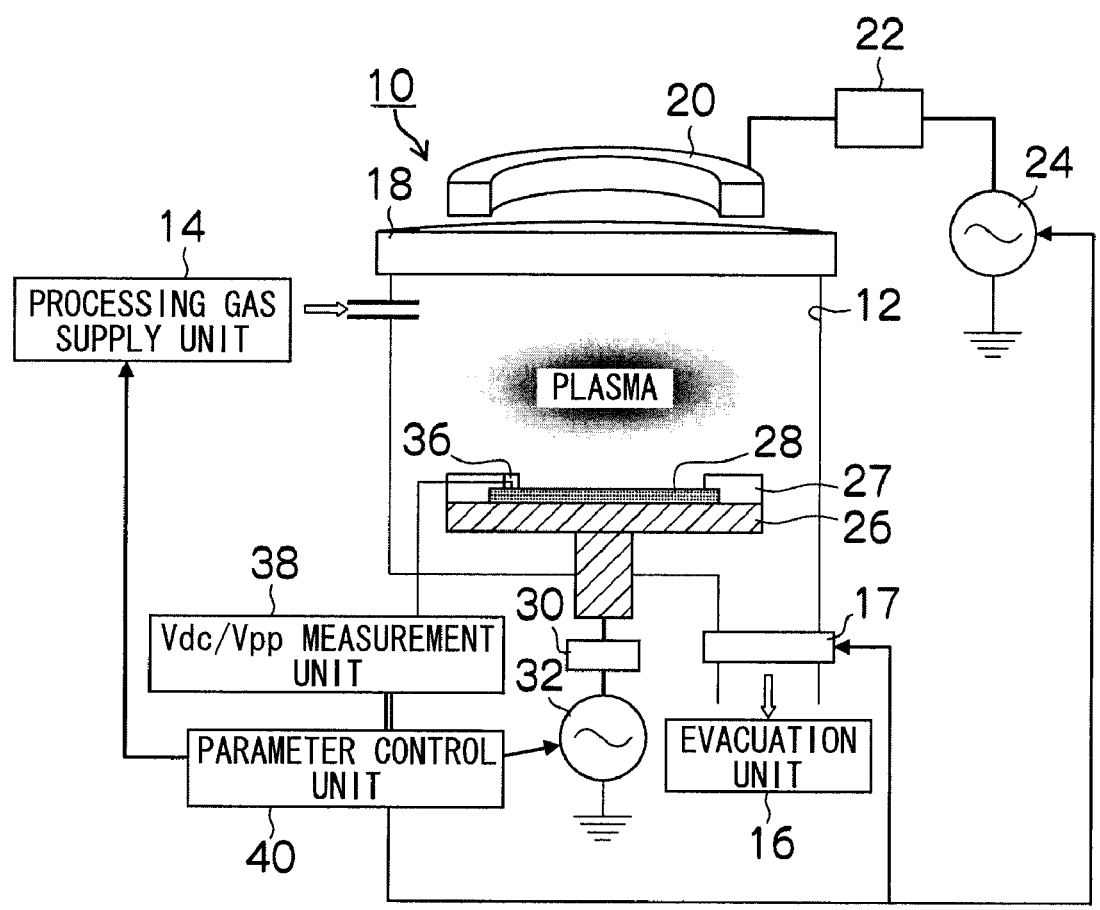
FIG. 1 is a diagram showing the general composition of a plasma etching apparatus according to an embodiment of the present invention.

FIG. 1 is a diagram showing the general composition of a plasma etching apparatus according to an embodiment of the present invention. Here, an apparatus used in dry etching of silicon is described by way of an example. The dry etching apparatus 10 in FIG. 1 employs an Inductive Coupled Plasma (ICP); however, the implementation of the present invention is not limited in particular to this embodiment, and it is also possible to employ a system that uses a plasma source such as, for instance, a Helicon Wave Plasma (HWP), an Electron Cyclotron resonance Plasma (ECP), a microwave-excited Surface Wave Plasma (SWP), or the like.

The plasma etching apparatus 10 includes: a vacuum chamber 12; a processing gas supply unit 14, which supplies processing gas (etching gas) to the chamber 12; an evacuation unit 16, which evacuates gas from the chamber 12; and a pressure adjustment unit 17, which adjusts the pressure in the chamber 12. The pressure in the chamber 12 is adjusted by supplying the processing gas through the processing gas supply unit 14 to the chamber 12, while evacuating gas through the evacuation unit 16.

A dielectric window 18 is hermetically arranged on the upper face of the chamber 12, and a loop antenna 20 is arranged on the upper side (the atmosphere side) of the dielectric window 18. A high-frequency (RF) power source 24 for generating plasma is connected to the antenna 20 through a matching circuit (matching box) 22. The frequency of the high-frequency power source 24 can be in the range of 2 MHz to 60 MHz; and for example, 13.56 MHz. The high-frequency power source 24 can also be pulse-driven.

A substrate cooling mechanism (not shown) equipped with a clamp ring 27 is arranged on a stage 26 in the chamber 12, and a substrate 28 to be etched is mounted on the stage 26. A bias power source 32 for applying a bias voltage is connected to the stage 26 through a matching circuit 30. The frequency of the bias power source 32 can be in the range of 200 kHz to 13.56 MHz; and for example, 13.56 MHz. The bias power source 32 can also be pulse-driven, similarly to the high-frequency power source 24. Moreover, if the high-frequency power source 24 and the bias power source 32 are both pulse-driven, then it is desirable to provide a device that synchronizes the pulses of the power sources.

A Vdc/Vpp probe 36 is arranged in a clamp section including the clamp ring 27 for fixing the substrate 28, and is provided with a contact pin 36A and wiring 36B (see FIG. 3) arranged so as to directly contact the surface of the substrate 28. The contact pin 36A and the wiring 36B are made of a conductive material, such as stainless steel, platinum, or the like.

Since a high voltage of around 1 kV is applied to the surface of the substrate during etching, the wire of the Vdc/Vpp probe 36 is connected to a measurement unit 38 through a high-voltage probe unit (not shown), where the voltage is set to one 100 th or 1000 th part. The measurement unit 38 includes an oscilloscope, for example, and measures the voltage of the surface of the substrate. In the present embodiment, both the self-bias voltage (Vdc) and the peak-to-peak voltage (Vpp: the difference between the maximum voltage value and the minimum voltage value in one cycle) are measured.

The Vdc and Vpp values measured by the measurement unit 38 are inputted to a parameter control unit 40, in such a manner that the parameter control unit 40 can adjust various etching parameters on the basis of these measurement values. More specifically, the parameter control unit 40 can control the flow volume of the processing gas, the pressure in the chamber 12, the output of the high-frequency power source 24, the output of the bias power source 32, and the like. The parameter control unit 40 can be incorporated in a control unit that controls the whole of the plasma etching apparatus 10.

Figure 2:
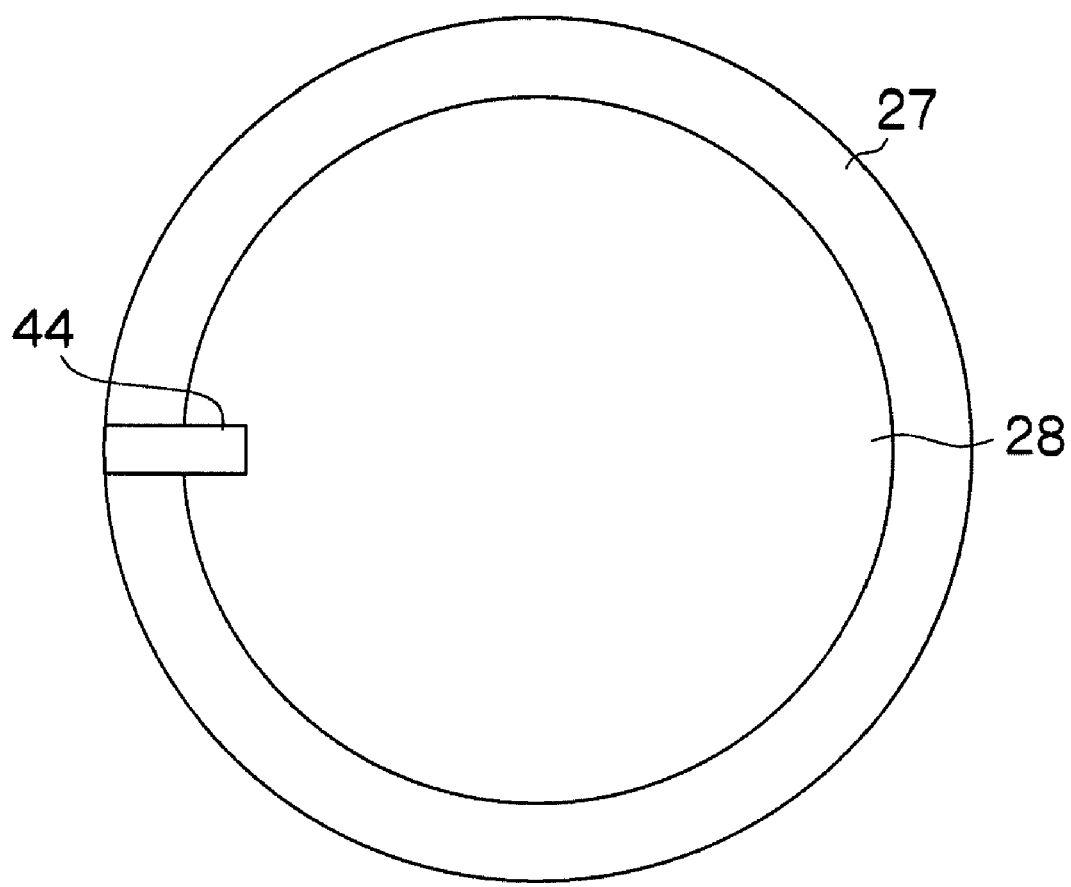
FIG. 2 is a plan diagram of the substrate held by a clamp ring on the stage.

FIG. 2 is a plan diagram of the substrate 28 held by the clamp ring 27 on the stage 26, and FIG. 3 is a cross-sectional diagram showing an embodiment of the wiring structure of a voltage measurement unit 44 arranged in the clamp ring 27. As shown in FIGS. 2 and 3, the voltage measurement unit 44 for measuring the voltage at the surface of the substrate 28 is arranged in a portion of the clamp ring 27. The voltage measurement unit 44 includes the Vdc/Vpp probe 36 described with reference to FIG. 1. As shown in FIG. 3, the contact pin 36A (corresponding to the "conductive member"), which can contact the surface of the substrate, and the wiring 36B, which extends from the contact pin 36A, are disposed inside the voltage measurement unit 44, and the periphery of these conductive members is covered with an insulating material 46. The contact pin 36A is pressed toward the surface of the substrate 28 by an elastic member or other device (not shown), so as to ensure secure contact with the surface of the substrate.

Furthermore, as for the substrate 28, a portion of the silicon layer is exposed to form a probe contact region, to which the contact pin 36A can contact, in a prescribed region on the surface of the substrate 28. As shown in FIG. 4, the substrate 28 to be etched has a mask pattern of resist 50 formed on the surface of the substrate 28 correspondingly to the target device shape; and in the present embodiment, a portion of the area outside of the device forming area on the substrate 28 is used as the probe contact region. Consequently, an opening section 52 in which the resist 50 has been removed is prepared for the probe contact region.

Figure 5B:
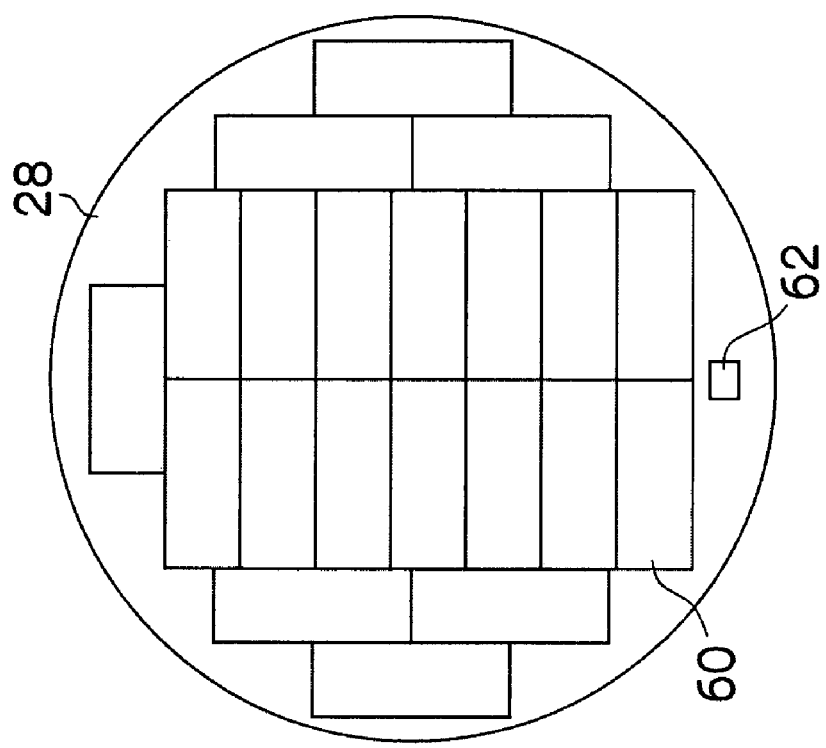
FIGS. 5A and 5B are plan diagrams showing examples of the positional relationship between the device area and the probe contact region on the substrate.
Figure 5A:
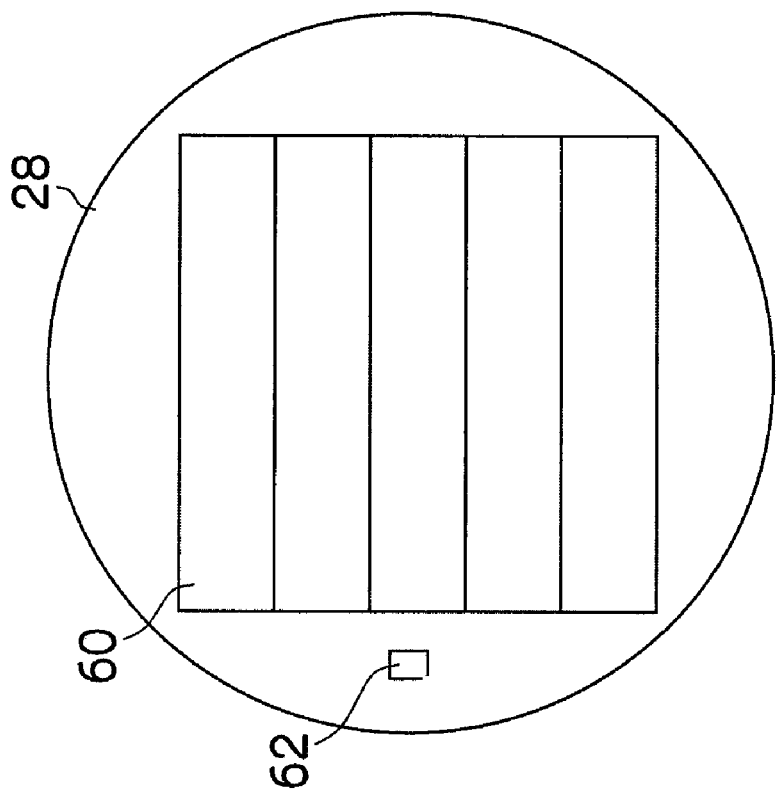

FIGS. 5A and 5B are diagrams showing examples of the forming of the probe contact region on the silicon wafer 28. Here, examples of manufacturing head modules of inkjet heads are described with reference to FIGS. 5A and 5B, and device areas and probe contact regions are denoted with reference numerals 60 and 62, respectively.

As shown in FIGS. 5A and 5B, the probe contact region 62 is provided at a suitable position outside the device area 60. When manufacturing a head module, it is suitable to use a wafer of 6-inch or 8-inch diameter. Various different designs can be adopted for the shape of the device area, but in all cases, a free space can be achieved in the region in the vicinity of the outer periphery of the substrate, and therefore it is possible to form the probe contact region (Vdc/Vpp measurement pattern) using this free space.

By thus forming the Vdc/Vpp measurement pattern in the free portion, it is possible to utilize the effective surface area of the substrate efficiently.

For example, if the central portion of the substrate is used principally as the device area, then a desirable mode is one where the probe contact region 62 is provided in a range of 5 mm to 20 mm from the outer periphery (edge) of the substrate toward the inside.

Application to Method of Manufacturing Inkjet Head

Next, the method of manufacturing an inkjet head using the above-described plasma etching apparatus 10 is explained.

<Example of Structure of Inkjet Head>

Figure 6:
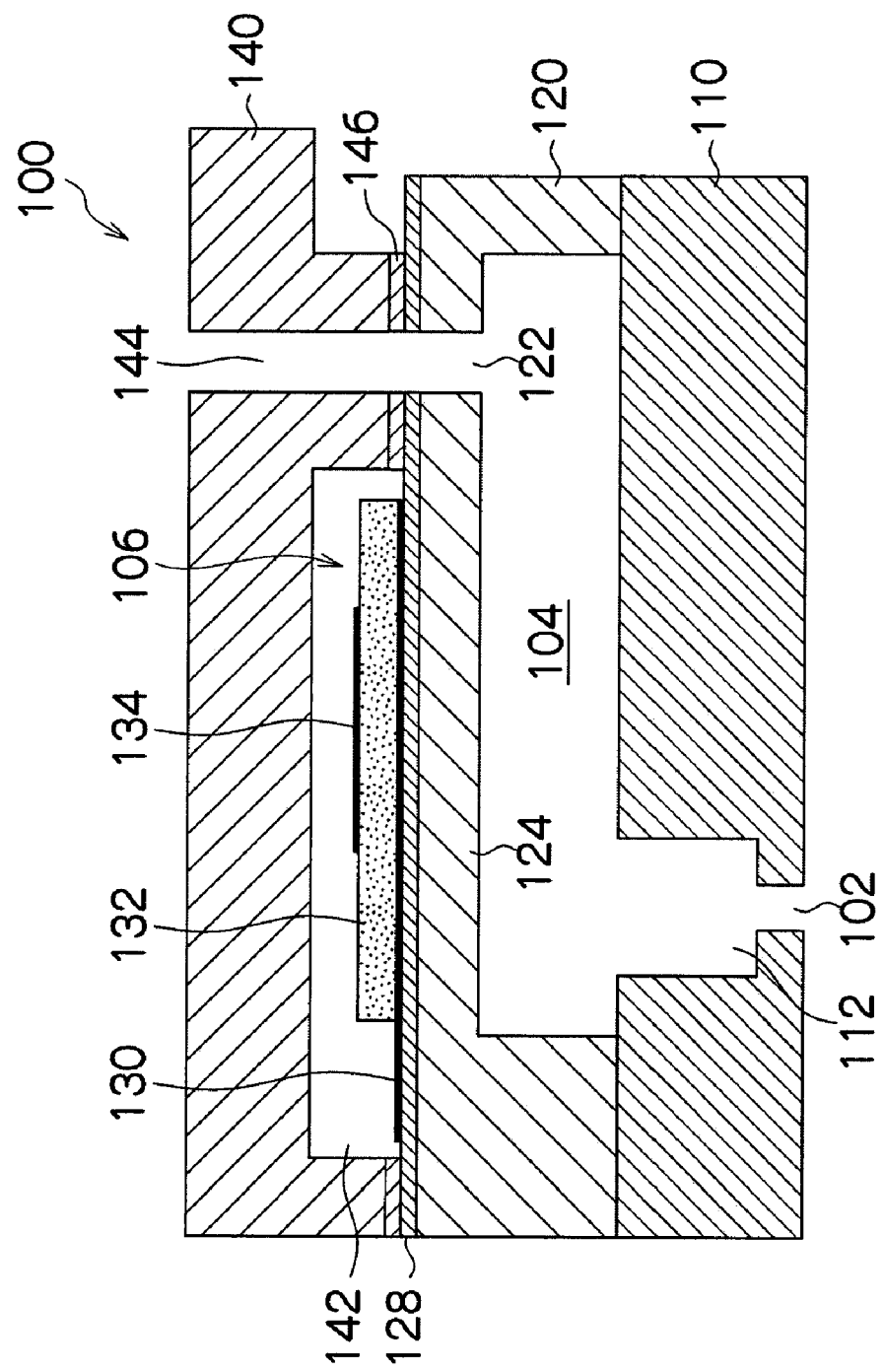
FIG. 6 is a cross-sectional diagram showing an example of the structure of an inkjet head.

FIG. 6 is a cross-sectional diagram showing an example of the structure of an inkjet head 100 which is manufactured by the method of manufacturing the inkjet head according to an embodiment of the present invention. FIG. 6 shows a cross-sectional view of one nozzle (an ejection element unit).

The inkjet head 100 shown in FIG. 6 has a structure in which a nozzle plate 110, a pressure chamber plate 120 and a cover plate 140 are overlaid and bonded together. The nozzle plate 110 is formed with a nozzle aperture 102, which is a liquid ejection port, and a nozzle connection channel 112, through which the liquid flows from a pressure chamber 104 to the nozzle aperture 102.

The pressure chamber plate 120 is formed with a recess section, which is a space for the pressure chamber 104, and a supply port 122, through which the liquid is filled into the pressure chamber 104. An insulating film 128 (e.g., a film of $SiO_2$) is formed over the pressure chamber plate 120.

Furthermore, a portion of the pressure chamber plate 120 (the ceiling portion of the pressure chamber 104) functions as a diaphragm 124, on which a piezoelectric element 106 is arranged. The piezoelectric element 106 is constituted of a lower electrode (common electrode) 130, a piezoelectric film 132, and an upper electrode (individual electrode) 134.

The cover plate 140 is formed with a recess section 142, which is an accommodating space for the piezoelectric element 106, and a supply flow channel section 144, which connects to the supply port 122 of the pressure chamber 104. The cover plate 140 is bonded on the pressure chamber plate 120 with an adhesive layer 146 so as to cover the piezoelectric element 106 on the diaphragm 124.

The supply flow channel section 144 passing through the cover plate 140 connects with a common flow channel (common liquid chamber) (not shown), and the common flow channel is connected to an ink tank (not shown). The ink supplied from the ink tank is distributed to the respective pressure chambers 104 in the inkjet head 100 through the common flow channel.

When a drive voltage is applied to the individual electrode 134, the piezoelectric element 106 deforms, thereby changing the volume of the pressure chamber 104. This causes a pressure change which results in the ink being ejected through the nozzle aperture 102. When the piezoelectric element 106 returns to its original position after ejecting the ink, the pressure chamber 104 is replenished with new ink from the common flow channel through the supply port 122.

The plate members 110, 120 and 140 constituting the inkjet head 100 have the prescribed recess sections and opening sections formed by etching silicon substrates.

Below, the process of manufacturing the nozzle plate 110 is described as an example.

Process of Manufacturing Nozzle Plate

FIGS. 7A to 7K are step diagrams showing a method of manufacturing the nozzle plate 110.

<Step 1: Preparing Substrate (FIG. 7A)>

Figure 7A:
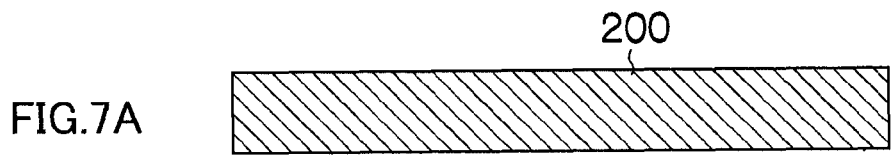
FIGS. 7A to 7K are step diagrams showing a method of manufacturing an inkjet head according to an embodiment of the present invention.
Figure 7B:
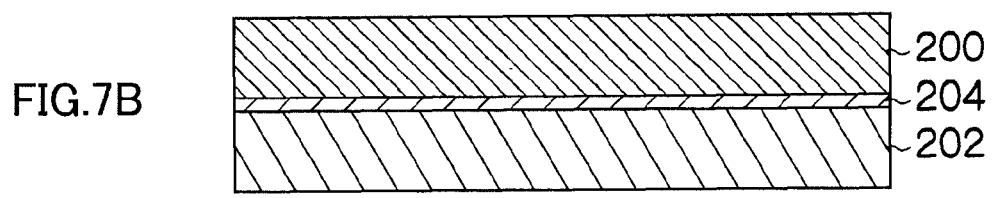

Firstly, a silicon substrate 200 is prepared as shown in FIG. 7A. The thickness of the silicon substrate 200 is set to a suitable thickness taking account of the length of the flow channel (the length of the nozzle connection channel 112) and the length of the nozzle 102. For example, the silicon substrate having a thickness of 350 μm is used in the present embodiment.

<Step 2: Attaching Dummy Substrate (FIG. 7B)>

Thereupon, the silicon substrate 200 is attached to a dummy substrate 202 though an adhesive layer 204. A silicon substrate can be used as the dummy substrate 202. There are no particular restrictions on the thickness of the dummy substrate 202, and this thickness can be 625 um, for example. An adhesive or an adhesive sheet, or the like, can be used to bond the dummy substrate 202 and the silicon substrate 200, and desirably, these substrates are bonded together by using an adhesive that enables detachment in a later step. For example, the two substrates are attached to each other using REVAL-PHA made by Nitto Denko Corporation.

<Step 3: Patterning Mask (FIG. 7C)>

Figure 7C:
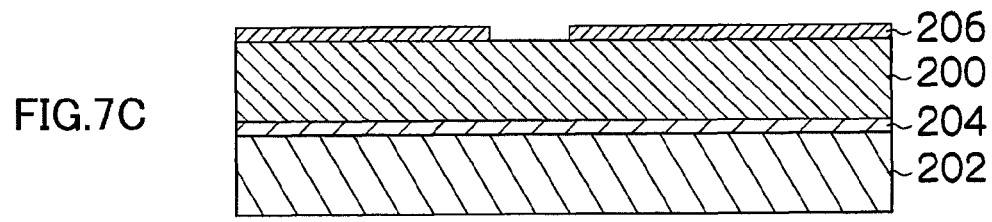

Next, as shown in FIG. 7C, a mask pattern 206 is formed on the surface of the silicon substrate 200. For the material of the mask layer, it is possible to use a hard mask, such as an oxide film ($SiO_2$) or aluminum, or a photosensitive resin, such as photoresist. In particular, a desirable mode is one where a photoresist is used for the mask, since the number of steps can be reduced if the photoresist is used.

For the photoresist, it is possible to use, for example, an OFPR series resist or a TSMR series resist made by Tokyo Ohka Kogyo, or a 1500 series resist or a 6000 series resist made by AZ Corporation, or the like.

Here, the method of forming a resist mask is described.

Firstly, a resist layer is formed on the whole surface of the silicon substrate 200 by means of a method such as spin coating or spray coating, or the like.

Thereupon, soft baking (pre-baking) of the resist layer is carried out. This soft baking step can be carried out at an optimal temperature (for example, 90° C. to 120° C.) of the resist material used, by means of a hot plate or oven, or the like.

Thereupon, exposure is carried out. This exposure can be carried out with a light exposure amount which is optimal for the resist material used, using an aligner or stepper. For example, if the resist layer is of OFPR-800 made by Tokyo Ohka Kogyo and has the thickness of 1 μm, then an optimal exposure amount is 120 mJ/cm$^2$. A post-exposure bake (PEB) can be then carried out, depending on the resist material used.

Subsequently, development is carried out. The whole of the substrate including the resist layer is immersed in a developer solution, the substrate is then rinsed in pure water, and the substrate is then dried, whereby the resist layer is developed. For example, in the case of OFPR-800, the substrate is immersed for approximately 60 seconds in a developer solution NMD-3 made by Tokyo Ohka Kogyo, rinsed twice for 60 seconds with pure water, and the water content adhering to the substrate is then removed by a spin drier, or the like.

Finally, post-baking is carried out. The post-baking step is carried out by heating the substrate using a hot plate or oven. The heating temperature in this case is 100° C. to 200° C. approximately, and heating can be carried out for 1 minute to 60 minutes. For example, in the case of OFPR-800, heat is applied for 90 seconds at a heating temperature of 110° C. using a hot plate.

Thus, it is possible to form a resist mask (mask pattern 206) on the surface of the silicon substrate 200 as shown in FIG. 7C.

<Step 4: Forming Ink Flow Channels by Silicon Etching (FIG. 7D)>

Figure 7D:
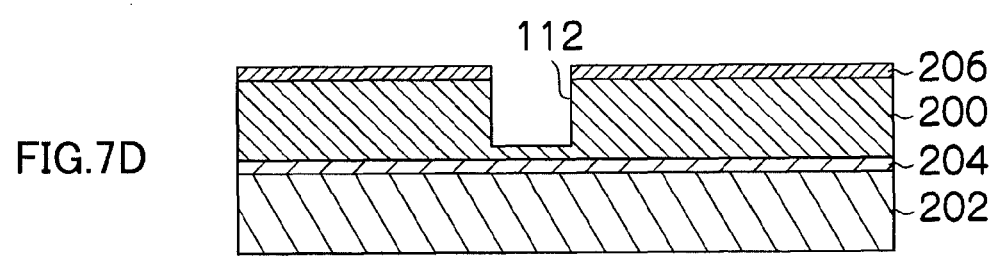

Next, as shown in FIG. 7D, ink flow channels (here, the portion of the nozzle connection channels 112 shown in FIG. 6) are formed by etching the silicon substrate 200 by the dry etching method. The depth of the ink flow channel is 300 μm, for example, and the etching depth can be set by appropriately specifying the etching time.

Etching of the silicon substrate is carried out in the steps of forming the ink flow channels (the nozzle connection channels 112) and the apertures of the nozzles (the nozzle apertures 102). The plasma etching apparatus 10 described with reference to FIG. 1 is used in these etching steps.

When the nozzle plates 110 are mass-produced, then it is necessary to etch several tens to several hundreds of substrates in one day. In each silicon etching step, the Vdc and/or Vpp voltage value at the surface of the substrate is measured and this data is stored. The value when an optimal shape was obtained is specified as a target value, the measurement value obtained by monitoring the Vdc and/or Vpp voltage value at the start of etching is compared with the target value, and the etching parameters are adjusted in such a manner that the measurement value becomes the same with the target value.

Moreover, when carrying out deep etching as in the nozzle connection channels 112, it is possible to obtain a vertical etching shape as well as achieving a uniform etching rate, by adjusting the etching parameters in such a manner that the measurement value during the etching process becomes the same with the target value at all times. By this means, since the etching is ended at an accurate timing, then it is possible to make the depth of the flow channels uniform at all times.

Furthermore, a mode can also be adopted according to which the measurement value profile during the etching process obtained when an optimal shape was obtained is specified as a target value, and the etching parameters are continuously adjusted in such a manner that the temporal variation (profile) of the measurement value obtained by monitoring the Vdc and/or Vpp voltage value during an etching process becomes equal to the profile of the target value.

The dry etching in the present embodiment is desirably based on a Bosch process, which repeatedly carries out etching and deposition of a protective film, or a method which adds oxygen to a fluorochemical gas, and it is particularly desirable to use a Bosch process in which a resist mask can be employed. By means of the method of this kind, it is possible to form ink flow channels corresponding to the nozzle connection channels 112 by etching the silicon substrate 200 to a prescribed depth.

The Bosch process employs $SF_6$ (sulfur hexafluoride) or a mixture of $SF_6$ and $O_2$ (oxygen) during etching, and employs $C_4F_8$ (octafluorocyclobutane) when forming a protective film (while forming a side wall protective film), the etching and protective film formation steps being carried out repeatedly.

<Concrete Example of Bosch Process>

The etching step is carried out for 15 seconds in a condition where the flow rate of $SF_6$ is 200 sccm, the vacuum level is 3 Pa, the RF output for plasma generation is 2000 W, and the bias output is 15 W; whereupon the protective film formation step is carried out using $C_4F_8$ at 100 sccm, the vacuum level of 1 Pa, the RF output for plasma generation of 1500 W, and the bias output of 0 W. These etching step and deposition step are alternately carried out repeatedly.

Firstly, in the etching step, the Vdc value during etching is measured. If the measured Vdc value is different to the target Vdc value, then the etching parameters are changed. For example, if the Vdc value is lower than the target value, then the output of the bias power source 32 is raised. If, conversely, the Vdc value is higher than the target value, then the output of the bias power source 32 is lowered. In adjusting the Vdc value, apart from adjusting the bias power source 32, it is also possible to adjust the output of the high-frequency power source 24 (RF output) or the processing gas flow volume, the processing pressure, or the like.

According to the present embodiment, since it is possible to accurately measure the voltage at the surface of the substrate and the etching parameters are appropriately controlled by using this measurement result, then the shape accuracy and depth accuracy of the etching are improved, and reproducibility is improved yet further. By this means, high-precision processing becomes possible.

<Step 5: Removing Mask (FIG. 7E)>

Figure 7E:
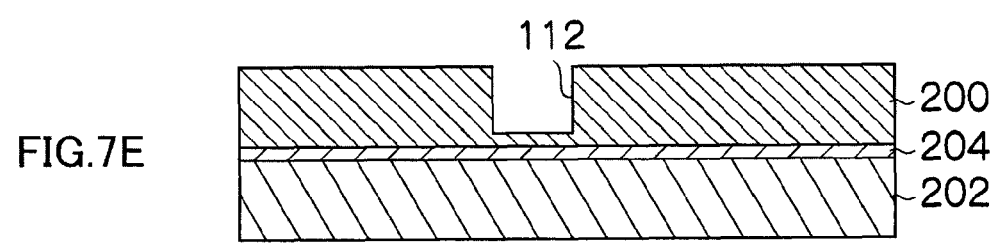

Thereupon, as shown in FIG. 7E, the resist mask pattern 206 is removed. In order to remove the resist mask, a special detachment solution or ashing process can be used. The resist detachment solution can be, for example, Stripper-502A made by Tokyo Ohka Kogyo, or AZ Remover 100 made by AZ Corporation. The ashing process can employ an oxygen plasma. It is possible to use inductive coupling plasma (ICP), a microwave asher or a barrel asher. For example, the ashing process can be carried out by a microwave-excited Surface Wave Plasma (SWP) using oxygen gas at 200 sccm and 30 Pa, and microwave output of 1 kW.

<Step 6: Removing Dummy Substrate (FIG. 7F)>

Figure 7F:
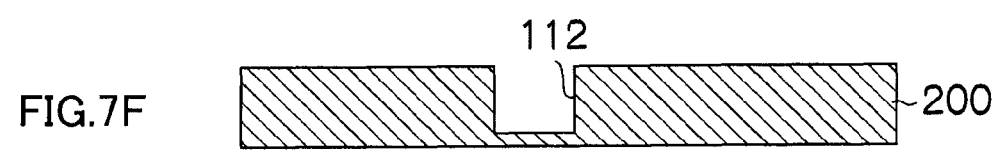

Next, as shown in FIG. 7F, the dummy substrate 202 is removed. In order to remove the dummy substrate 202, removal can be carried out under the recommended conditions for the bonding material used (the adhesive used in the adhesive layer 204). If REVALPHA made by Nitto Denko Corporation has been used, then it is possible to readily remove the dummy substrate 202 by applying heat. The removal temperature is 90° C. to 150° C.

<Step 7: Attaching Dummy Substrate (FIG. 7G)>

Figure 7G:
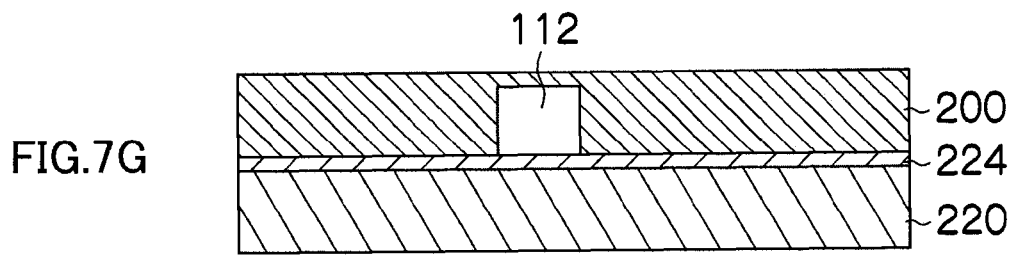

Thereupon, the nozzle substrate (silicon substrate 200) obtained in FIG. 7F is turned over, and as a preparation for forming holes for the nozzle apertures 102, the silicon substrate 200 is attached to a dummy substrate 220 through an adhesive layer 224 as shown in FIG. 7G. A silicon substrate can be used as the dummy substrate 220, and the thickness can be set to 625 μm, for example. The dummy substrate 220 and the silicon substrate 200 can be bonded together by using an adhesive or an adhesive sheet that enables detachment in a later step. For example, the two substrates are attached to each other using REVALPHA made by Nitto Denko Corporation.

<Step 8: Patterning Mask (FIG. 7H)>

Figure 7H:
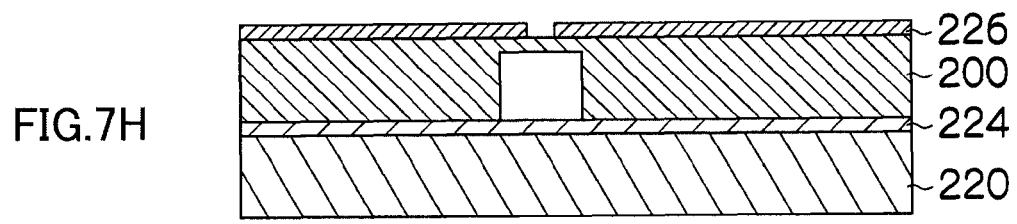

Next, as shown in FIG. 7H, a mask pattern 226 is formed on the surface of the silicon substrate 200 (the ejection surface side of the nozzle plate 110).

For the material of the mask layer, it is possible to use a hard mask, such as an oxide film ($SiO_2$) or aluminum, or a photosensitive resin, such as photoresist. Similarly to the step 3, a mode using a photoresist is desirable. For the photoresist, it is possible to use, for example, an OFPR series resist or a TSMR series resist made by Tokyo Ohka Kogyo, or a 1500 series resist or a 6000 series resist made by AZ Corporation, or the like.

For the method of forming a resist mask, similarly to the step 3, firstly, a resist layer is formed on the whole surface of the silicon substrate 200 by means of a method such as spin coating or spray coating, or the like.

Thereupon, soft baking (pre-baking) of the resist layer is carried out. This soft baking step can be carried out at an optimal temperature (for example, 90° C. to 120° C.) for the respective resist materials, by means of a hot plate or oven, or the like.

Thereupon, exposure is carried out. This exposure can be carried out with a light exposure amount which is optimal for the resist material used, using an aligner or stepper. For example, if the resist layer is of OFPR-800 made by Tokyo Ohka Kogyo and has the thickness of 1 µm, then an exposure amount of 120 mJ/cm$^2$ is optimal. A post-exposure bake (PEB) can be then carried out, depending on the resist material used.

Subsequently, development is carried out. The whole of the substrate including the resist layer is immersed in a developer solution, the substrate is then rinsed in pure water, and the substrate is then dried, whereby the resist layer is developed. For example, in the case of OFPR-800, the substrate is immersed for approximately 60 seconds in a developer solution NMD-3 made by Tokyo Ohka Kogyo, rinsed twice for 60 seconds with pure water, and the water content adhering to the substrate is then removed by a spin drier, or the like.

Finally, post-baking is carried out. The post-baking step is carried out by heating the substrate using a hot plate or oven. The heating temperature in this case is 100° C. to 200° C. approximately, and heating can be carried out for 1 minute to 60 minutes. For example, in the case of OFPR-800, heat is applied for 90 seconds at a heating temperature of 110° C. using a hot plate.

Thus, it is possible to form a resist mask (mask pattern 226) on the surface of the silicon substrate 200 as shown in FIG. 7H.

<Step 9: Forming Nozzle Portions by Silicon Etching (FIG. 7I)>

Figure 7I:
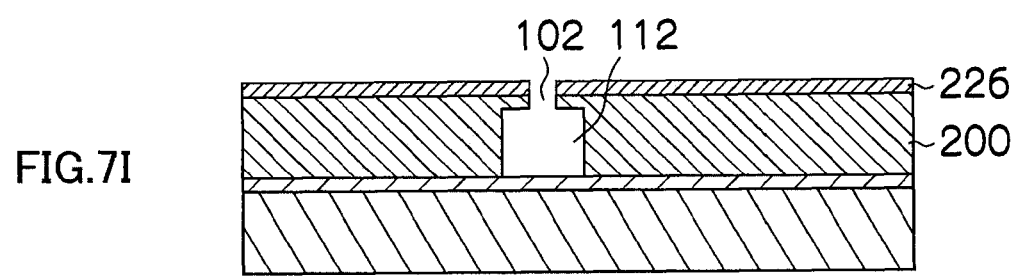

Next, as shown in FIG. 7I, nozzle portions (here, the portion of the nozzle apertures 102 shown in FIG. 6) are formed by etching the silicon substrate 200 by a dry etching method. The depth of this flow channel is 50 µm, for example, and the etching depth can be set by appropriately specifying the etching time.

The etching method is similar to the ink flow channel forming step in the step 4 described above.

<Step 10: Removing Mask (FIG. 7J)>

Figure 7J:
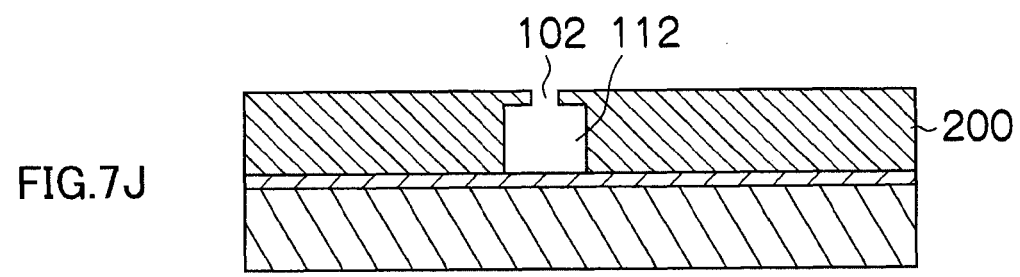

Next, the mask pattern 226 of the resist is removed as shown in FIG. 7J. The method of removing the resist mask is similar to the step 5 described above.

<Step 11: Removing Dummy Substrate (FIG. 7K)>

Figure 7K:
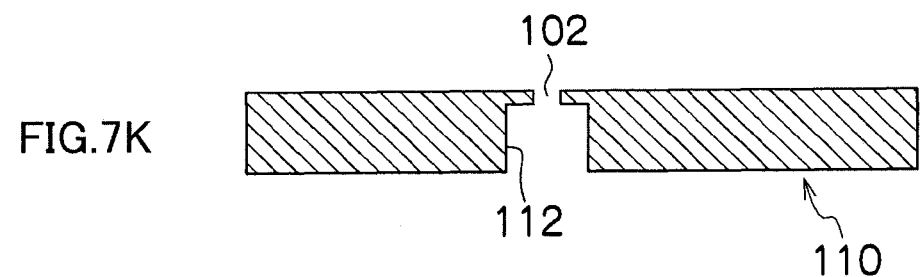

Next, as shown in FIG. 7K, the dummy substrate 222 is removed. The method of removing the dummy substrate 222 is similar to the step 6 described above.

Thus, the nozzle plate 110 is obtained.

Each of the pressure chamber plate 120 and the cover plate 140 described with reference to FIG. 6 is also manufactured by a process similar to the manufacturing process of the nozzle plate 110 described above. By forming the electrode films 130 and 134 and the piezoelectric film 132, and the like, on the pressure chamber plate 120, and overlaying and bonding these plate members together, the inkjet head 100 such as that shown in FIG. 6 is obtained.

Modification of Embodiment

In the embodiment described above, the probe 36 is placed directly in contact with the surface of the substrate 200 being etched, the Vdc value of the substrate is measured through the probe 36, and etching is carried out while adjusting the etching conditions in such a manner that the measured Vdc value coincides with the target value (the value when a correct processed shape was obtained in the previous etching process); however, it is also possible to adopt a mode in which etching is carried out by adjusting the etching conditions in each step of etching while monitoring the voltage at the surface of the substrate and feeding back the measurement results.

A desirable mode is one where, in addition to the voltage measurement at the surface of the substrate, a Langmuir probe is placed in the vicinity of the substrate stage so that the electron density is measured during the etching, and by carrying out processing while adjusting the etching conditions on the basis of these measurement values, it is possible to carry out processing of even higher precision.

Furthermore, a desirable mode is one where the width of the mask pattern is measured before etching, and if this width is smaller than the design value, then etching is carried out under conditions whereby the side etching volume during etching becomes greater. The etching conditions in this case are adjusted to conditions whereby a desired (any) Vdc value, or the like, is obtained, using measurement data gathered by the method described above (measurement data for the plasma parameters, such as Vdc, Vpp, electron density, and the like). By this means, it is possible to carry out a trimming process in the etching step, and the device processing accuracy can be improved dramatically.

Further Application Example

FIGS. 7A to 7K show the example of the manufacture of the inkjet head module, but the scope of application of the present invention is not limited to this example, and the invention may also be applied to the manufacture of various MEMS devices, or the manufacture of semiconductor devices.

Appendix

As has become evident from the detailed description of the embodiments given above, the present specification includes disclosure of various technical ideas described below.

It is preferable that a plasma etching method comprises: an etching step of placing, on a stage in a chamber, a substrate in which a prescribed mask pattern is formed by a protective film on a surface of a material to be etched, generating a plasma in the chamber while supplying processing gas to the chamber, and etching a portion of the material corresponding to an opening portion in the mask pattern; a voltage measurement step of, during the etching in the etching step, measuring a voltage at the surface of the material on a side where the mask pattern is formed, through a conductive member that is placed in contact with the surface of the material on the side where the mask pattern is formed; and a control step of controlling an etching condition in the etching step in accordance with a measurement result obtained in the voltage measurement step.

According to this mode, it is possible to measure the voltage at the surface of the etched material of the processed substrate accurately during etching, regardless of the material and shape, and the like, of the rear surface side of the processed substrate. Accordingly, it is possible to appropriately adjust the etching conditions on the basis of the measurement result, and hence the processing accuracy can be improved and the reproducibility of processing between substrates can be improved.

Preferably, the method further comprises a data store step of storing the measurement result, wherein when processing a subsequent substrate, the etching condition for the subsequent substrate is adjusted in the control step so as to obtain the measurement result same with the stored measurement result having been obtained in the etching of the substrate previously processed.

According to this mode, measurement data for etching steps carried out previously is accumulated, and by controlling the etching conditions so as to obtain a particular measurement value by referring to the measurement data when a satisfactory shape has been achieved, it is possible to reproduce the satisfactory processing shape.

Preferably, the substrate is provided with a voltage measurement region where a portion of the protective film is opened in order to place the conductive member in contact with the surface of the material.

A desirable mode is one where the voltage measurement region is provided outside of the device area of the substrate surface, and the voltage is measured by making the probe contact this voltage measurement region.

Preferably, the voltage measurement region is arranged at a position 5 mm to 20 mm toward an inner side from an edge of the substrate.

It is desirable that the region where the voltage measurement probe is contacted is formed near the edge of the substrate surface, and desirably, this region is provided in the margin of the area where the target device is to be formed. A desirable mode is one where the clamping region of the clamp section is also taken into account and the voltage measurement region is provided within a range of 5 mm to 20 mm from the edge of the substrate.

Preferably, the conductive member is arranged in a clamp member by which the substrate is held on the substrate.

A desirable mode is one where the conductive member for the voltage measurement is arranged in a clamp section which serves to fix the substrate on the stage.

Preferably, the measurement result obtained in the voltage measurement step includes at least one of a self-bias voltage and a peak-to-peak voltage at the surface of the material.

A desirable mode is one where at least one of the self-bias voltage (Vdc) and the peak-to-peak voltage (Vpp) is measured as a plasma parameter whereby the state of the plasma during etching is indirectly ascertained.

Preferably, the etching condition controlled in the control step includes at least one of output of a high-frequency power source which generates the plasma in the chamber, output of a bias power source which applies a bias voltage to the stage, a flow volume of the processing gas, and a pressure in the chamber.

It is possible to optimize the etching conditions by controlling either one of, or a suitable combination of, these parameters on the basis of the voltage measurement result at the surface of the etched material.

It is also preferable that a method of manufacturing a liquid ejection head comprises the steps of: forming, in a silicon substrate, at least one of recess sections and opening sections that are to become flow channels in a liquid ejection head, by etching the silicon substrate by the above-described plasma etching method; and then manufacturing the liquid ejection head using the silicon substrate.

It is possible to manufacture plate members, such as a nozzle plate, a pressure chamber plate, and a cover plate, which constitute a liquid ejection head, by employing the plasma etching method according to the present invention. It is also possible to manufacture each one of various plate members which constitute a liquid ejection head, by employing the plasma etching method according to the present invention, and it is also possible to manufacture a portion of the plate members (at least one plate member) by employing the plasma etching method according to the present invention.

It is also preferable that a plasma etching apparatus comprises: a stage which holds a substrate having a prescribed mask pattern formed by a protective film on a surface of a material to be etched; a chamber inside which the stage is arranged; an evacuation device which evacuates gas from the chamber; a processing gas supply device which supplies processing gas to the chamber; a high-frequency power source which generates a plasma in the chamber; a bias power source which applies a bias voltage to the stage; a conductive member which contacts the surface of the material on a side where the mask pattern is formed, of the substrate held on the stage; a voltage measurement device which measures a voltage at the surface of the material on the side where the mask pattern is formed, of the substrate held on the stage, through the conductive member; and a control device which controls an etching condition in accordance with a measurement result obtained by the voltage measurement device.

According to this mode, it is possible to measure the voltage at the surface of the etched material of the processed substrate accurately during etching, regardless of the material and shape, and the like, of the rear surface side of the processed substrate. Accordingly, it is possible to appropriately adjust the etching conditions on the basis of the measurement results, and hence the processing accuracy can be improved and the reproducibility of processing between substrates can be improved.

Preferably, the control device stores the measurement result obtained in an etching step of the substrate as a target value, and when processing a subsequent substrate, adjusts the etching condition for the subsequent substrate so as to obtain the measurement result same with the target value.

According to this mode, it is possible to reproduce a satisfactory processed shape obtained by an etching step that has been carried out previously.

Preferably, the stage has a clamp member by which the substrate is held on the stage; and the conductive member is arranged in the clamp member.

Preferably, the measurement result obtained by the voltage measurement device includes at least one of a self-bias voltage and a peak-to-peak voltage at the surface of the material.

A desirable mode is one where at least one of the self-bias voltage (Vdc) and the peak-to-peak voltage (Vpp) is measured as a plasma parameter whereby the state of the plasma during etching is indirectly ascertained.

Preferably, the etching condition controlled by the control device includes at least one of output of the high-frequency power source, output of the bias power source, a flow volume of the processing gas, and a pressure in the chamber.

It is possible to optimize the etching conditions by controlling either one of, or a suitable combination of, these parameters on the basis of the voltage measurement result at the surface of the etched material.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A plasma etching method, comprising:
    an etching step of placing, on a stage in a chamber, a substrate in which a prescribed mask pattern is formed by a protective film on a surface of a material to be etched, generating a plasma in the chamber while supplying processing gas to the chamber, and etching a portion of the material corresponding to an opening portion in the mask pattern;
    a voltage measurement step of, during the etching in the etching step, measuring a voltage at the surface of the material on a side where the mask pattern is formed, through a conductive member that is placed in contact with the surface of the material on the side where the mask pattern is formed; and a control step of controlling an etching condition in the etching step in accordance with a measurement result obtained in the voltage measurement step.

2. The method as defined in claim 1, further comprising a data store step of storing the measurement result, wherein when processing a subsequent substrate, the etching condition for the subsequent substrate is adjusted in the control step so as to obtain the measurement result same with the stored measurement result having been obtained in the etching of the substrate previously processed.

3. The method as defined in claim 1, wherein the substrate is provided with a voltage measurement region where a portion of the protective film is opened in order to place the conductive member in contact with the surface of the material.

4. The method as defined in claim 3, wherein the voltage measurement region is arranged at a position 5 mm to 20 mm toward an inner side from an edge of the substrate.

5. The method as defined in claim 1, wherein the conductive member is arranged in a clamp member by which the substrate is held on the substrate.

6. The method as defined in claim 1, wherein the measurement result obtained in the voltage measurement step includes a self-bias voltage at the surface of the material.

7. The method as defined in claim 1, wherein the measurement result obtained in the voltage measurement step includes a peak-to-peak voltage at the surface of the material.

8. The method as defined in claim 1, wherein the etching condition controlled in the control step includes output of a high-frequency power source which generates the plasma in the chamber.

9. The method as defined in claim 1, wherein the etching condition controlled in the control step includes output of a bias power source which applies a bias voltage to the stage.

10. The method as defined in claim 1, wherein the etching condition controlled in the control step includes a flow volume of the processing gas.

11. The method as defined in claim 1, wherein the etching condition controlled in the control step includes a pressure in the chamber.

12. A method of manufacturing a liquid ejection head, comprising the steps of:

forming, in a silicon substrate, at least one of recess sections and opening sections that are to become flow channels in a liquid ejection head, by etching the silicon substrate by the plasma etching method as defined in claim 1; and then manufacturing the liquid ejection head using the silicon substrate.

* * * * *